United States Patent
Törnqvist

(10) Patent No.: US 9,394,610 B2
(45) Date of Patent: Jul. 19, 2016

(54) SOURCE AND ARRANGEMENT FOR PROCESSING A SUBSTRATE

(75) Inventor: Runar Törnqvist, Kirkkonummi (FI)

(73) Assignee: BENEQ OY, Vantaa (FI)

(*) Notice: Subject to any disclaimer, the term of this patent is extended or adjusted under 35 U.S.C. 154(b) by 730 days.

(21) Appl. No.: 13/639,394

(22) PCT Filed: Apr. 29, 2011

(86) PCT No.: PCT/FI2011/050391
§ 371 (c)(1),
(2), (4) Date: Oct. 25, 2012

(87) PCT Pub. No.: WO2011/135190
PCT Pub. Date: Nov. 3, 2011

(65) Prior Publication Data
US 2013/0047921 A1 Feb. 28, 2013

(30) Foreign Application Priority Data
Apr. 30, 2010 (FI) .................................. 20105472

(51) Int. Cl.
*C23C 16/455* (2006.01)
*C23C 16/54* (2006.01)
*C23C 16/44* (2006.01)

(52) U.S. Cl.
CPC ........... *C23C 16/545* (2013.01); *C23C 16/4412* (2013.01); *C23C 16/45551* (2013.01); *C23C 16/45574* (2013.01); *C23C 16/45578* (2013.01); *C23C 16/45591* (2013.01)

(58) Field of Classification Search
CPC ............ C23C 16/545; C23C 16/45578; C23C 16/4412; C23C 16/45551; C23C 16/45591; C23C 16/45574

USPC ....................... 118/715; 156/345.33
See application file for complete search history.

(56) References Cited

U.S. PATENT DOCUMENTS

| 3,384,049 A | | 5/1968 | Capita |
|---|---|---|---|
| 3,637,434 A | | 1/1972 | Nakanuma et al. |
| 4,422,407 A | | 12/1983 | Bessot et al. |
| 4,501,766 A | * | 2/1985 | Suzuki .............. C23C 16/505 118/50.1 |
| 4,597,986 A | | 7/1986 | Scapple et al. |
| 5,527,391 A | * | 6/1996 | Echizen .............. C23C 16/50 118/718 |
| 5,629,054 A | * | 5/1997 | Kanai .............. C23C 16/511 118/723 MW |

(Continued)

FOREIGN PATENT DOCUMENTS

WO  WO 2008/130369 A1  10/2008

OTHER PUBLICATIONS

Finnish Search Report issued in Application No. 20105472; Dated Nov. 11, 2010 (With Translation).

(Continued)

*Primary Examiner* — Rudy Zervigon
(74) *Attorney, Agent, or Firm* — Oliff PLC

(57) ABSTRACT

A source for feeding one or more gaseous precursors onto a surface of a substrate and an arrangement for processing the substrate by way of subjecting the surface of the substrate to alternately repetitive surface reactions of the precursors, the source including a gas feed member for feeding at least one or more precursors onto the surface of the substrate. The gas feed member is adapted rotatable about a rotation axis, the rotation axis being arranged to extend substantially parallel to the surface of the substrate.

19 Claims, 4 Drawing Sheets

(56) References Cited

U.S. PATENT DOCUMENTS

| | | | | | |
|---|---|---|---|---|---|
| 5,683,548 | A | * | 11/1997 | Hartig | C23C 16/507 118/723 I |
| 5,976,257 | A | * | 11/1999 | Kanai | C23C 16/46 118/718 |
| 6,083,355 | A | | 7/2000 | Spence | B29C 59/14 204/164 |
| 6,096,389 | A | * | 8/2000 | Kanai | C23C 16/511 118/723 MR |
| 6,209,480 | B1 | * | 4/2001 | Moslehi | H01J 37/321 118/723 I |
| 6,764,658 | B2 | * | 7/2004 | Denes | B29C 59/14 118/723 E |
| 6,821,563 | B2 | * | 11/2004 | Yudovsky | C23C 16/4412 427/248.1 |
| 7,166,233 | B2 | * | 1/2007 | Johnson | H01J 37/32082 118/723 E |
| 7,452,827 | B2 | * | 11/2008 | Gianoulakis | C23C 16/4412 257/E21.161 |
| 7,789,961 | B2 | * | 9/2010 | Nelson | C23C 16/45517 118/715 |
| 7,819,081 | B2 | * | 10/2010 | Kawasaki | C23C 16/452 118/723 E |
| 8,187,679 | B2 | * | 5/2012 | Dickey | C23C 16/452 427/569 |
| 8,236,106 | B2 | * | 8/2012 | Iizuka | C23C 16/4412 118/50 |
| 2003/0106643 | A1 | * | 6/2003 | Tabuchi | C23C 16/24 156/345.35 |
| 2004/0067641 | A1 | * | 4/2004 | Yudovsky | C23C 16/4412 438/680 |
| 2005/0126487 | A1 | * | 6/2005 | Tabuchi | C23C 16/24 118/723 E |
| 2006/0234514 | A1 | * | 10/2006 | Gianoulakis | C23C 16/4412 438/758 |
| 2006/0236937 | A1 | * | 10/2006 | Powell | C23C 14/0629 118/726 |
| 2007/0095286 | A1 | | 5/2007 | Baek et al. | |
| 2007/0163499 | A1 | * | 7/2007 | Finn | B01J 19/088 118/722 |
| 2007/0238311 | A1 | | 10/2007 | Levy | |
| 2007/0281089 | A1 | | 12/2007 | Heller et al. | |
| 2008/0193643 | A1 | | 8/2008 | Dip | |
| 2009/0236041 | A1 | * | 9/2009 | Iizuka | C23C 16/4412 156/345.34 |
| 2010/0043976 | A1 | * | 2/2010 | Watanabe | H01J 37/32192 156/345.41 |
| 2011/0076421 | A1 | * | 3/2011 | Lee | C23C 16/045 427/569 |
| 2012/0031559 | A1 | * | 2/2012 | Dhindsa | H01J 37/32091 156/345.26 |
| 2012/0034786 | A1 | * | 2/2012 | Dhindsa | C23C 16/4412 438/710 |
| 2013/0047921 | A1 | * | 2/2013 | Tornqvist | C23C 16/4412 118/715 |
| 2015/0086715 | A1 | * | 3/2015 | Knaapen | C23C 16/4401 427/255.7 |
| 2015/0275369 | A1 | * | 10/2015 | Terada | C23C 16/45578 118/715 |
| 2015/0376785 | A1 | * | 12/2015 | Knaapen | C23C 16/45551 427/557 |

OTHER PUBLICATIONS

Written Opinion of the International Searching Authority issued in Application No. PCT/FI2011/050391; Dated Aug. 12, 2011.

International Search Report issued in Application No. PCT/FI2011/050391; Dated Aug. 12, 2011.

Oct. 3, 2013 Office Action issued to Finnish Patent Application No. 20105472 (with translation).

* cited by examiner

SOURCE AND ARRANGEMENT FOR PROCESSING A SUBSTRATE

The present invention relates to a source for processing a substrate with one or more gaseous precursors and, more precisely, to a source in accordance with the preamble of claim 1 for feeding one or more gaseous precursors onto a substrate surface in order to process the substrate by way of subjecting the substrate surface being processed to alternately repetitive surface reactions of the precursors, said source comprising a gas feed means for feeding one or more precursors onto the substrate surface. Furthermore, the present invention relates to an arrangement for processing a substrate with one or more precursors and, more precisely, to an arrangement in accordance with the preamble of claim 26 by way of subjecting the substrate surface being processed to alternately repetitive surface reactions of the precursors.

In deposition methods such as the atomic layer deposition method (ALD method) or the like methods wherein the substrate surface is subjected to alternately repetitive surface reactions of precursors, the growth rate of deposited layers is typically slow. To obtain desired layer thicknesses in the deposition process, the substrate surface must be subjected plural successive times to the precursor pulses. Conventionally, the atomic layer deposition method has been implemented by subjecting a substrate in a reaction chamber to alternating surface reactions by way of feeding the precursors in a pulsed manner successively to the reaction chamber and injecting between the precursor pulses a flushing medium pulse into the reaction chamber. In this kind of conventional atomic layer deposition method, one deposition process cycle comprising pulsed feed of precursors and flushing pulses therebetween takes about 0.5 seconds. The layer thickness growth achievable by the atomic layer deposition method is about 1 Ångström/deposition cycle, whereby the maximum growth rate will be 12 nm/min.

A problem of the prior art arrangements is that in many industrial applications the above-cited growth rate is far too slow and unsuitable for carrying out deposition onto a substrate with a sufficient efficiency. Strip-like, planar or flat substrates often need a layer thickness of a few nanometers or more. Herein a thin-film thickness of 10 nm would take about 1 min to produce. To achieve a substrate transfer speed of about 100 m/min in an industrial plant, the reaction chamber length of an atomic layer deposition system need be about 100 m for growing the deposited layer to a sufficient thickness. However, use of reaction chambers of such a length is not possible in practice.

BRIEF SUMMARY OF THE INVENTION

Accordingly, it is an object of the invention to provide a source and arrangement for feeding one or more gaseous precursors onto the surface of a substrate in processing the substrate by way of subjecting the substrate surface to alternately repetitive surface reactions of the precursors in a fashion that overcomes the above-described disadvantages. The object of the invention is attained by virtue of a source in accordance with the characterizing part of claim 1 characterized in that the gas feed member is a cylindrical part comprising one or more elongated gas feed channels extending parallel to a first rotation axis so as to feed one or more precursors in a direction substantially transversal to said first rotation axis. An additional goal of the invention is further attained by virtue of an arrangement in accordance with the characterizing part of claim 12 characterized by having said first rotation axis aligned substantially parallel to the surface of the substrate.

The preferred embodiments of the invention are disclosed in the dependent claims.

The invention is based on providing a rotary source for feeding precursors onto the surface of a substrate for processing the substrate by the atomic layer deposition method or the like process in such a fashion that the substrate surface being processed is subjected to alternately repetitive surface reactions of the precursors. The source comprises a cylindrical gas feed member arranged rotatable about a first rotation axis and arranged to feed one or more precursors transversely in relation to the first rotation axis. In a preferred embodiment, the gas feed member is adapted to feed one or more precursors in a direction substantially orthogonal or radial to said first rotation axis. The gas feed member may additionally be adapted to feed a flushing medium and simultaneously sucking a precursor and flushing medium in order to exhaust the same. The gas feed member is advantageously also implemented such that it can accomplish the feeding of the flushing medium and exhaust of the precursors and the flushing medium in a direction transversely to said first rotation axis, advantageously in a direction perpendicular or radial with respect to said first rotation axis.

The present invention is further based on a concept of providing an arrangement of processing a substrate by way of feeding precursors onto the surface of a substrate for treating the substrate surface by the atomic layer deposition method or a like method through subjecting the substrate surface to alternately repetitive surface reactions of the precursors by way feeding the precursors onto the substrate surface with the help of a rotary source. Said arrangement comprises as described above a cylindrical source adapted in close vicinity of the substrate so that said first rotation axis is aligned substantially parallel to the substrate surface. During the rotation of the gas feed member about said first rotation axis in the vicinity of the substrate surface, the precursors can be alternately fed onto the substrate surface in order to subject the substrate alternately to surface reactions of the precursors while the substrate moves relative to the source.

A benefit of the source and arrangement according to the invention is that it facilitates efficient and extremely quick processing of substrates, particularly those having a planar surface, by way of subjecting the substrate surface to alternate surface reactions of precursors. In other words, the use of a rotary source permits rapid deposition of coatings of desired thickness in conjunction with, e.g., the production line of the substrate or in a roll-to-roll process when the rotation speed of the rotary source is elevated to 10 turns per second or even up to 100 turns per second, possibly even higher. Furthermore, the use of a rotary source allows a plate-like, strip-like or similar planar substrate to be processed over its entire width at once in a homogeneous manner.

BRIEF DESCRIPTION OF THE DRAWINGS

Next some preferred exemplary embodiments of the invention are described in more detail by way of making reference to the appended drawings in which.

DETAILED DESCRIPTION OF THE INVENTION

Figure 1:
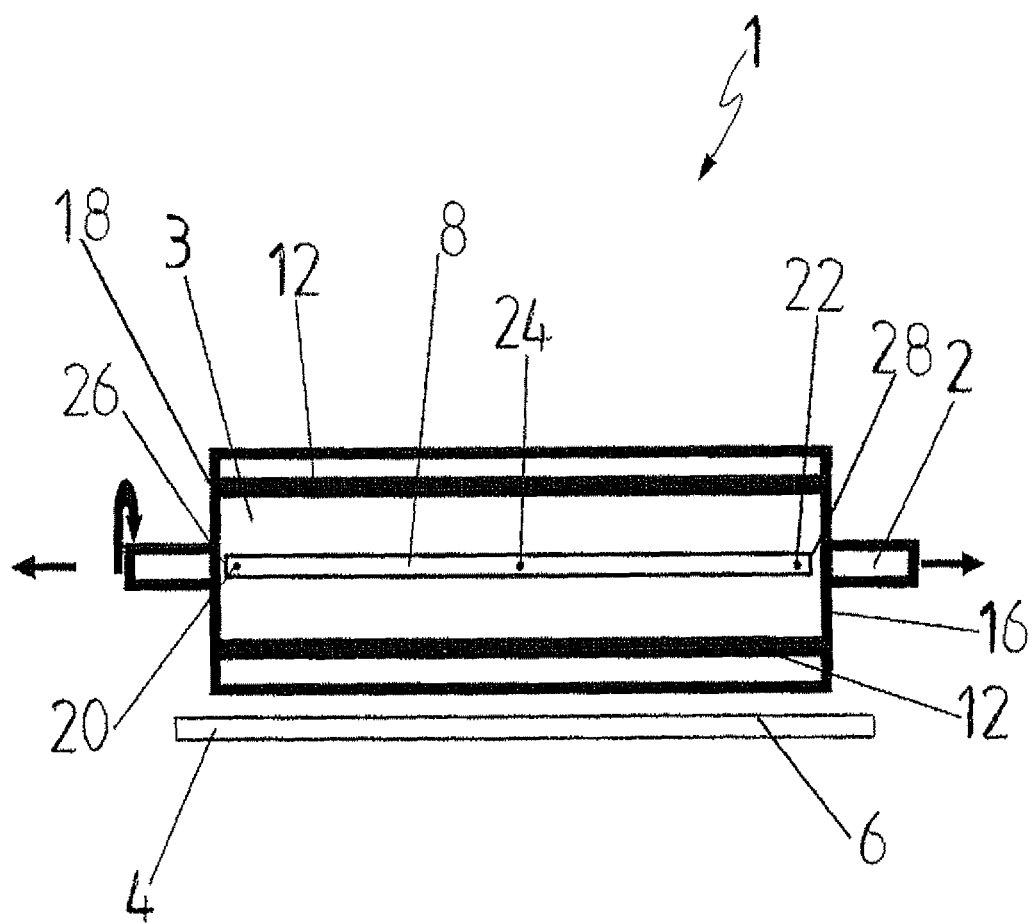
FIG. 1 shows schematically a source depicted in the drawing of FIG. 1 in aside elevation view.

Referring to FIG. 1 therein is shown in a schematic side elevation view a source 1 as an exemplary embodiment of the present invention for feeding one or more gaseous precursors onto a surface 6 of a substrate 4 in order to process the substrate 4 by way of subjecting the substrate surface being processed to alternately repetitive surface reactions of the precursors. The source 1 comprises a gas feed member 3 for feeding at least one or more precursors onto the surface 6 of the substrate 4 and a first rotation axis 2 about which the gas feed member 3 can be rotated. The gas feed member 3 is advantageously shaped as a cylindrical or roll-like member having an essentially circular cross section and has a first end 16 and a second end 18 in the direction of the first rotation axis 2. Alternatively, the gas feed member 3 may have another kind of cross-sectional shape, e.g., oblong, triangular, square or some other polygonal shape. The length of gas feed member 3 in the direction of the first rotation axis 2 can be varied according to the needs of actual implementation and it can be adapted to essentially meet the width of the substrate being processed, for instance. An essential feature of the present invention is that the gas feed member 3 is not limited to any specific shape, but rather, the gas feed member 3 can be implemented in any desired shape. Advantageously, however, the gas feed member is made rotationally symmetrical with regard to the first rotation axis 2. Furthermore, the first rotation axis 2 is advantageously situated along the center axis of the gas feed member 3. The source 1 may further comprise a power means (not shown) for rotating the first rotation axis. The power means can be, e.g., an electric motor that may be incorporated in the source 1 as a part thereof or, alternatively, a separate part whereto the source 1 is connectable.

The gas feed member 3 is adapted to feed one or more precursors in a direction essentially transverals with regard to the first rotation axis 2. As shown in FIG. 1, the gas feed member 3 is provided with one or more gas feed channels 8 adapted to feed one or more precursors or a flushing medium. Additionally, the gas feed member 3 can be provided with one or more suction channels 12 for vacuuming and removing the precursors or the flushing medium. In accordance with FIG. 1, the gas feed channels 8 and suction channels 12 are adapted to extend between the first end 16 and the second end 18 of the gas feed member 3 in a direction substantially parallel to the first rotation axis 2. In other words, the gas feed channels 8 and suction channels 12 are elongated channels extending over the entire length of the gas feed member 3. Accordingly, the gas feed channels have a first end 28 and second end 26 as shown in FIG. 1. Alternatively, the gas feed channels 8 and suction channels 12 may have a shorter length thus extending only over a partial length of the gas feed member 3. Furthermore, there may be two or more gas feed channels 8 and suction channels 12 aligned in succession in the direction of the rotation axis 2. The gas feed channels 8 and suction channels 12 or at least some of them are implemented as recesses or grooves extending inwards from the outer surface of the gas feed member 3. In an alternative embodiment, the gas feed channels 8 and suction channels 12 or at least some of them are implemented as crests, ridges or the like projections extending outwards from the outer surface of the gas feed member 3.

The gas feed channels 8 incorporate one or more feed openings 20, 22 for feeding of a gaseous precursor or flushing medium. The feed openings 20, 22 may be located equidistantly in the direction of the first rotation axis 2 over the entire length of the gas feed channel 8 or, alternatively, the gas feed channel 8 may incorporate a single elongated feed opening extending over the entire length of the gas feed channel 8 or only a portion thereof thus permitting gas feeding along the entire length of the gas feed channel 8. The gas feed openings 20, 22 may be pinhole-like opening having a circular, square or other kind of polygonal cross-sectional shape. Alternatively, the feed openings 20, 22 are situated in the direction of the rotation axis 2 at the ends of the gas feed channel 8, at its first and second end 28, 26 or in close vicinity thereof. The feed opening or openings 20, 22 may also be located only at the first or second end 28, 26 of the gas feed channel. The feed openings 20, 22 may also be located substantially in the direction of the first rotation axis 2 at the center of the gas feed channel 8.

The gas feed channel 8 can further be provided with one or more exhaust openings 24 for removing or vacuuming the precursors or flushing media or inducing a flow of a flushing medium in conjunction with the feeding thereof. In the embodiment shown in FIG. 1, the exhaust opening and openings 24 are located substantially in the direction of the rotation axis 2 at the center of the gas feed channel 8 in the direction of the rotation axis 2, while the feed openings 20, 22 are located to the ends 26, 28 of the gas feed channel 8 or in close vicinity of the ends. In an alternative embodiment the exhaust openings 24 can be located in the direction of the rotation axis 2 at the ends 26, 28 of the gas feed channel or in close vicinity thereof, while the feed openings 20, 22 are located to substantially at the center of the gas feed channel 8. In a yet another embodiment the exhaust openings 24 can be located substantially in the direction of the rotation axis 2 at the first end 28 of the gas feed channel 8 or in close vicinity thereof, while the feed openings are located at the other end 26 of the gas feed channel 8 or in close vicinity thereof.

As described above, the gas that may be a precursor or a flushing medium can be fed from the gas feed member via the gas feed channel 8 substantially in a cross-wise, orthogonal or radial direction relative to the first rotation axis 2. However, due to the location of the feed openings 20, 22 and the exhaust openings 24, the gas may flow partially in the gas feed channel 8 or outside thereof also in the direction of the first rotation axis. In other words, varying the location of the feed openings 20, 22 and the exhaust openings 24 allows the gas being released from the gas feed member to be distributed over the entire length of the gas feed member 3 in the direction of the first rotation axis 2. The above discussion relates to a gas feed channel 8 that may serve as a precursor inflow channel for feeding of one or more precursors or as flushing medium feed channel for feeding of one or more flushing media.

The suction channels 12 may be implemented in the gas feed member 3 in the same fashion as the above-described gas feed channels 8, and they may incorporate suction openings (not shown) that may be located, e.g., in any of the above-described places similarly as the feed openings 20, 22. With the help of the suction channels 12, the precursors or the flushing media or both can be removed from the surface 6 of substrate 4 or the vicinity thereof. Advantageously, the suction channels 12 are located to remove precursors or flushing media from the surface 6 of substrate 4 or the vicinity thereof substantially transversely, perpendicularly or radially relative to the first rotation axis 2 of the gas feed member 3. In an embodiment, the gas feed channels 8 and the suction channels 12 are situated entirely in the interior of the gas feed member 3 and the surface of the gas feed member has only feed openings 20, 22, exhaust openings or suction openings or all of them.

The gas feed member 3 can be provided with one or more containers, flasks or equivalent tanks (not shown) for storing and feeding one or more precursors or flushing media or both in the gas feed channels 8 or, respectively, for storing and recovering a precursor or a flushing medium or both of these sucked or removed via one or more suction channels 12. Herein the containers incorporated in the gas feed member 3 rotate along with the gas feed member 3 about the first rotation axis 2. In an alternative embodiment the gas feed member 3 incorporates flow conduits (not shown) for feeding precursors or flushing media to the gas feed member 3 from outside thereof. Hereby the flow conduits can be accomplished, e.g., in the interior of the first rotation axis 2 thus making it possible to feed precursors and flushing media into the gas feed channels 8 via the first rotation axis 2. In a similar fashion the gases to be removed via the suction channels 12 can be taken away from the gas feed member 3. Hereby the containers for precursors and gases to be removed can be located outside the source 1.

Figure 2:
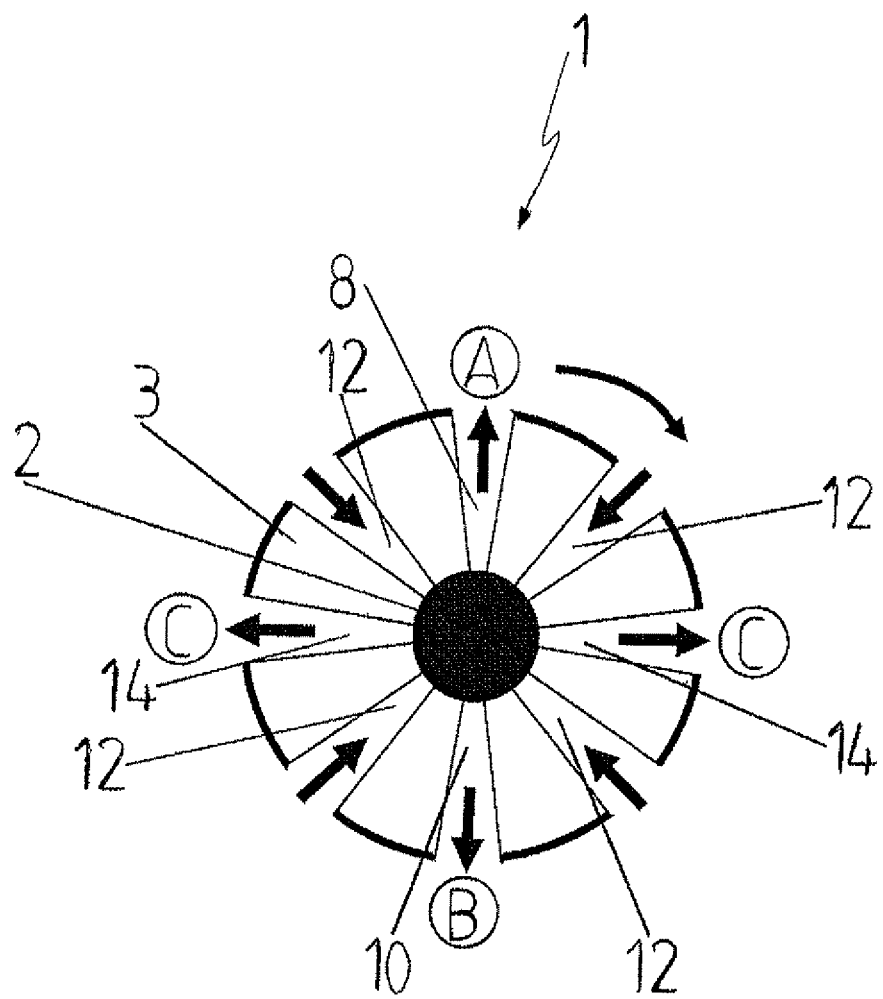
FIG. 2 shows an embodiment of the present invention in a schematic cross-sectional view.

In FIG. 2 is shown a schematic cross-sectional view of the source illustrated in FIG. 1 comprising a gas feed member 3 adapted rotatable about a first rotation axis 2. The gas feed member incorporates a precursor feed channel 8 for feeding a first precursor A and a second precursor inflow channel 10 for feeding a second precursor B. While the first and the second precursor inflow channel 8, 10 are shown situated on opposite sides of the gas feed member 3, they may also be located in some other fashion spaced apart from each other along periphery of the gas feed member 3. It must further be noted that the gas feed member 3 may comprise two or more first precursor feed channels 8 and second precursor inflow channels 10. The first and second precursor feed channels 8, 10 are advantageously located alternatingly along the periphery of the gas feed member 3 as shown in the cross-sectional view of FIG. 2. Still further it must be noted that the gas feed member 3 may also comprise one or more gas feed channels (not shown) for feeding of a third precursor. Hereby one ALD cycle consists of three sequentially fed precursors. The gas feed member 3 also comprises one or more flushing medium feed channels 12 for feeding of a flushing medium C. As shown in FIG. 2, the flushing medium feed channels 12 are located between the precursor inflow channels 8, 10. Accordingly, in the embodiment of FIG. 2 the gas feed member 3 incorporates two flushing medium feed channels 12. Additionally, the gas feed member 3 comprises one or more suction channels 14 adapted to suck and exhaust gases, such as precursors A, B and flushing medium C, that have been fed to the surface of the substrate 4 or appear in vicinity thereof. The suction channels 14 may also be located between the precursor feed channels 8, 10 and, advantageously, also between the flushing medium feed channels 14 and the precursor feed channels 8, 10 as shown in FIG. 2. In all these arrangements, the precursors A, B can be fed as such or with the help of a carrier gas. The carrier gas can be co-fed with the precursor A, B so that the carrier gas transports the precursor to the surface 6 of substrate 4. The carrier gas is advantageously some inert gas such as nitrogen that does not react with the precursor A, B.

As denoted by arrows in FIG. 2, the gas feed member 3 is adapted to feed precursors A, B in a substantially perpendicular or radial direction relative to the first rotation axis 2. Advantageously, the gas feed member 3 is adapted to feed the precursors A, B in a direction substantially perpendicularly to the first rotation axis 2. It must be noted that an essential feature of the present invention comprises the arrangement of the gas feed member 3 to feed one or more precursors A, B, whereby it can comprise one or more precursor feed channels 8, 10 for feeding one or more precursors A, B. In other words, in the simplest embodiment of the present invention the gas feed member 3 has only one precursor feed channel 8 serving the feeding of one or more precursors A, B. As necessary in different applications, the source can be implemented such that it comprises a required set of precursor feed channels 8, 10, flushing medium feed channels 12 and suction channels 14. In the embodiment of FIG. 2, the gas feed member 3 comprises one first precursor feed channel 8 for feeding a first precursor A and one second precursor feed channel 10 for feeding a second B to the surface 6 of substrate 4 for subjecting the surface alternately to the surface reactions of the first precursor A and the second precursor B when the gas feed member 3 rotates about the first rotation axis 2.

Figure 3:
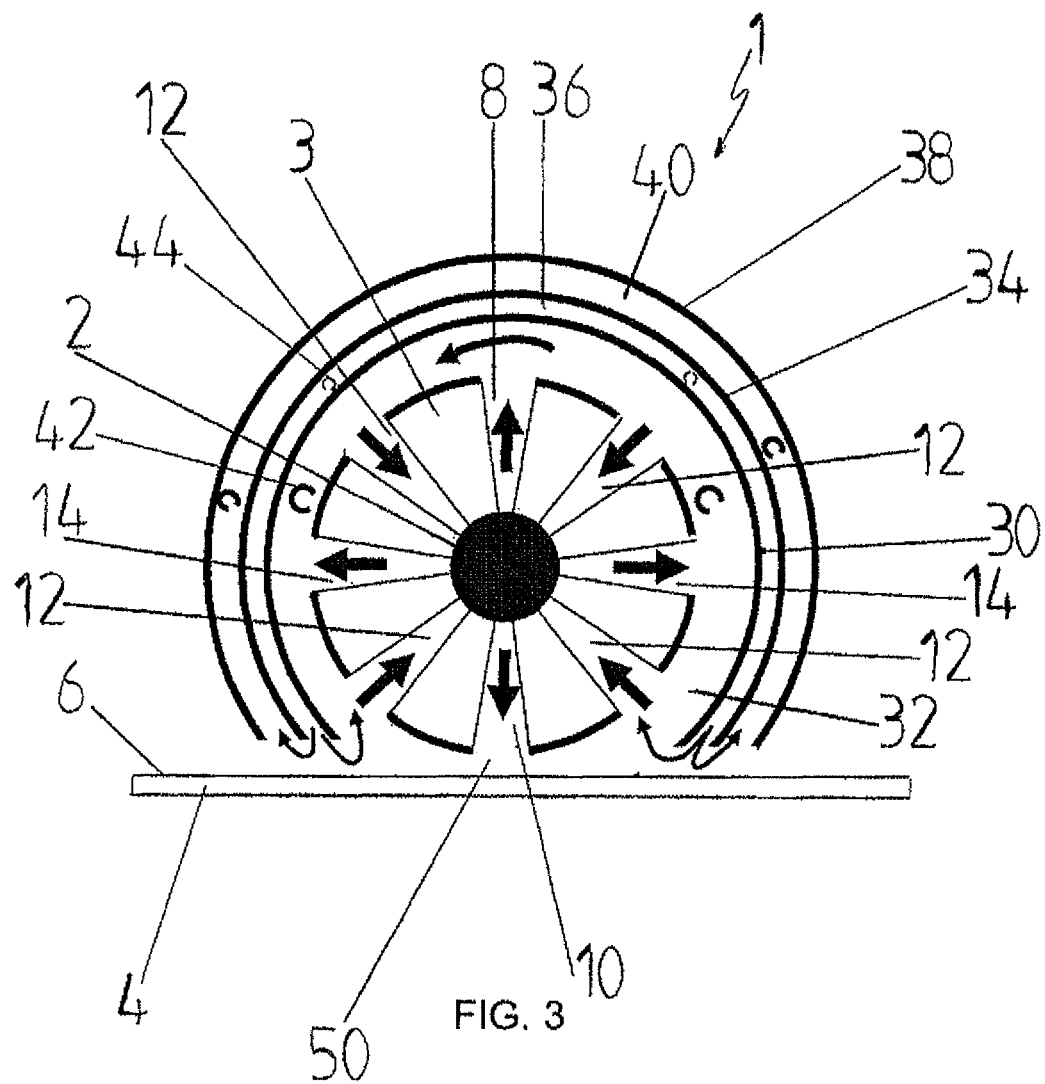
FIG. 3 shows another embodiment of the present invention in a schematic cross-sectional view.

In FIG. 3 is shown another embodiment of a source 1 according to the present invention. The source 1 of FIG. 3 comprises a gas feed member 3 and a first rotation axis 2. Enclosing the gas feed member 3 that is rotatable about the first rotation axis 2 is adapted a casing structure which is extended in the direction of the rotation axis 2, advantageously in a coaxial fashion. In the embodiment of FIG. 3, the casing structure comprises three casings 30, 34, 38 within each other preassembled at a given radial spacing from each other. It must be noted, however, that the source 1 may alternatively comprise only one casing 30 or a plurality of them, say, up to five or more coaxial casings. The casings 30, 34, 38 are adapted for feeding or exhausting of gases A, B, C or for both feed and exhaust of the same. As shown in FIG. 3, the casings 30, 34, 38 comprise a flow opening 50 extending in the direction of the rotation axis 2 so as to permit inflow of gases A, B, C into the casings 30, 34, 38 or out therefrom. The flow opening is advantageously arranged to extend partially or entirely between the first and second ends 16, 18 of the gas feed member 3 in the direction of the rotation axis 2. Alternatively the number of flow openings 50 may be two or more placed in succession in the direction of the rotation axis 2. Each one of the casings 30, 34, 38 may be configured to serve as suction casings that form a suction chamber via which gas A, B, C is sucked and removed or as feeding casings forming an infeed chamber via which an inert flushing medium C or precursor A, B can be introduced.

In the embodiment of FIG. 3, the source comprises a first casing 30 adapted to form a first suction chamber 32 between the gas feed member 3 and the first casing 30 for removal of gases A, B, C, a second casing 34 adapted to form a first feeding chamber 36 between the first casing 30 and the second casing 34 for feeding of precursor A, B or flushing medium C, and a third casing 38 adapted to form a third suction chamber 40 between the second casing 34 and the third casing 38 for removal of gases A, B, C. In other words, this casing structure can be used for processing a substrate by feeding precursors A, B via the feeding casing 34 of the casing structure. Alternatively, the casing structure can be used for isolating the gas feed member 3 from the surrounding environment by implementing either only one or more suction casings 30, 38 or one or more feeding casings 36 for feeding of flushing medium C. Furthermore, the feeding chamber 36 can be configured to form a plasma zone or ozone zone about the gas feed member 3. As is evident from the above, the casing structure about the gas feed member may comprise one or more separate casings 30, 34, 38 whose type and functionality can be selected to meet the needs of a given application. The suction casings 30, 38 may further be equipped with suction nozzles 42 through which suction and removal gases take place. Respectively, the feeding casing 34 may be equipped with feeding nozzles 44 via which the gases A, B, C being fed are introduced.

The suction casing 30, 38 with its suction nozzles 42 impose on the substrate 4 a suction that tends to pull the source and the substrate toward each other. If the substrate 4 is light and flexible, the suction casing 30, 38 or suction channel 12 incorporated in the gas feed member 3 may suck the substrate 4 toward the gas feed member 3. To counteract this, a suction means (not shown) may be adapted on the opposite side of substrate 4 with regard to the side facing the gas feed member 3, whereby the suction means pulls the substrate 4 away from the gas feed member 3 thus compensating for the force imposed by the gas feed member 3 on the substrate 4 and thereby provides a counter pressure. The suction means can be an integral part of the source 1.

The source 1 is adapted to process substrates 4 by way of subjecting the surface 6 of the substrate 4 to alternate surface reactions of precursors, e.g., as takes place in the atomic layer deposition method. Substrate 1 is particularly designed for processing plate-like, strip-like or similar substrates 4 having a planar surface. According to the invention an arrangement is provided comprising one or more sources 1 described above for processing substrates 4. The source is arranged to operate so that a first rotation axis 2 is adapted to extend substantially parallel to the surface 6 of the substrate 1 at a given distance from the surface 6 of the substrate 4, e.g., as shown in FIG. 3. Hereby the rotation of the gas feed member 3 about the rotation axis 2 implements alternate or repetitive feed of precursors A, B and possible flushing media to the surface 6 of the substrate 4. The gas feed member 3 is rotated at a speed of, e.g., 1 turn per minute or faster, 10-100 turns per minute or 1-100 turns per second about the first rotation axis 2, or even as fast as over 100 turns per second or, alternatively, less than 10 turns per second. During each turn the surface 6 of the substrate is subjected to one or more precursors A, B as many times as is the number of gas feed channels 8, 10 in the system. In the arrangement illustrated in FIG. 3 one growth cycle corresponds to one turn of the gas feed member 3, whereby having the speed of rotation of the gas feed member 3 adjusted to 5 turns per second, for instance, the growth rate on the surface 6 of the substrate 4 is 5 layers per second.

The system is advantageously arranged such that the source 1 is adapted movable with respect to the substrate 4 in a direction parallel to the surface 6 of the substrate 4. In other words, either the source 1 may be moved over the surface 6 of the substrate while the gas feed member 3 simultaneously rotates about the first rotation axis 2 or, alternatively, the source can be stationary while the substrate is moved and the gas feed member 3 simultaneously rotates about the first rotation axis 2. In a still further embodiment both the substrate 4 and the source 1 are adapted movable. In a preferred exemplary embodiment is implemented an arrangement according to the invention with the source operating in conjunction with a process line of a planar substrate 4, whereby the source 1 is placed on the process line so that the substrate 4 passes the source 1 at a distance suited for processing the surface 6 of the substrate 4. In certain embodiments the source 1 or the gas feed member 3 can be adapted rotatable about a second rotation axis (not shown) which is aligned substantially orthogonal with regard to the first rotation axis 2 and the surface 6 of the substrate 4. The source may also be adapted to move reciprocatingly over the surface 6 of the substrate 4. Then, the second rotation axis can be located, e.g., at the center point of the length of the first rotation axis 2 or to one end thereof so that the source 1 and the gas feed member 3 becomes rotatable in a horizontal direction over the surface 6 of the substrate 4 when the second rotation axis is aligned orthogonally with respect to the surface 6 of the substrate 4.

The source 1 is arranged so that the gas feed member 3 is spaced at a distance from the surface 6 of the substrate 4, whereby the surface 6 of the substrate 4 is subjected to gases A, B, C fed via the gas feed member 3. Advantageously the source 1 is placed so that the distance of the gas feed member 3 is not greater than 5 cm from the surface 6 of the substrate 4, advantageously not greater than 3 cm and most advantageously less than 1 cm from the surface 6 of the substrate 4. In certain embodiments, the distance of the gas feed member 3 from the surface 6 of the substrate 4 may also be less than 1 mm. As shown in FIG. 3, the source 1 is further aligned so that the open portion of the wall of one or more casings 30, 34, 38 is facing the surface 6 of the substrate 4. In certain embodiments the source 1 may also be located such that it can process simultaneously two substrates 4 when they are adapted to pass close to the substrate, e.g., at opposite sides of the source 1.

The feeding of precursors A, B or flushing medium C may be continuous whereby they are introduced steadily at a given flow rate. Alternatively, the feeding of the precursors A, B or the flushing medium C or, alternatively the feeding of both the precursors A, B and the flushing medium C can be pulsed so that they are introduced only intermittently, e.g., as metered aliquots, when the respective precursor inflow channel 8, 10 or the flushing medium feed channel 14 becomes substantially coincident with the surface 6 of the substrate 4 during the rotation of the gas feed member 3. Using a sparse or nonsaturated dosing or feeding of precursors A, B, the suction channels 12 or suction chambers 32 or even possibly both may be omitted from construction of the source inasmuch as then all of the fed precursor A, 13 reacts with the surface 6 of the substrate 4.

Figure 4:
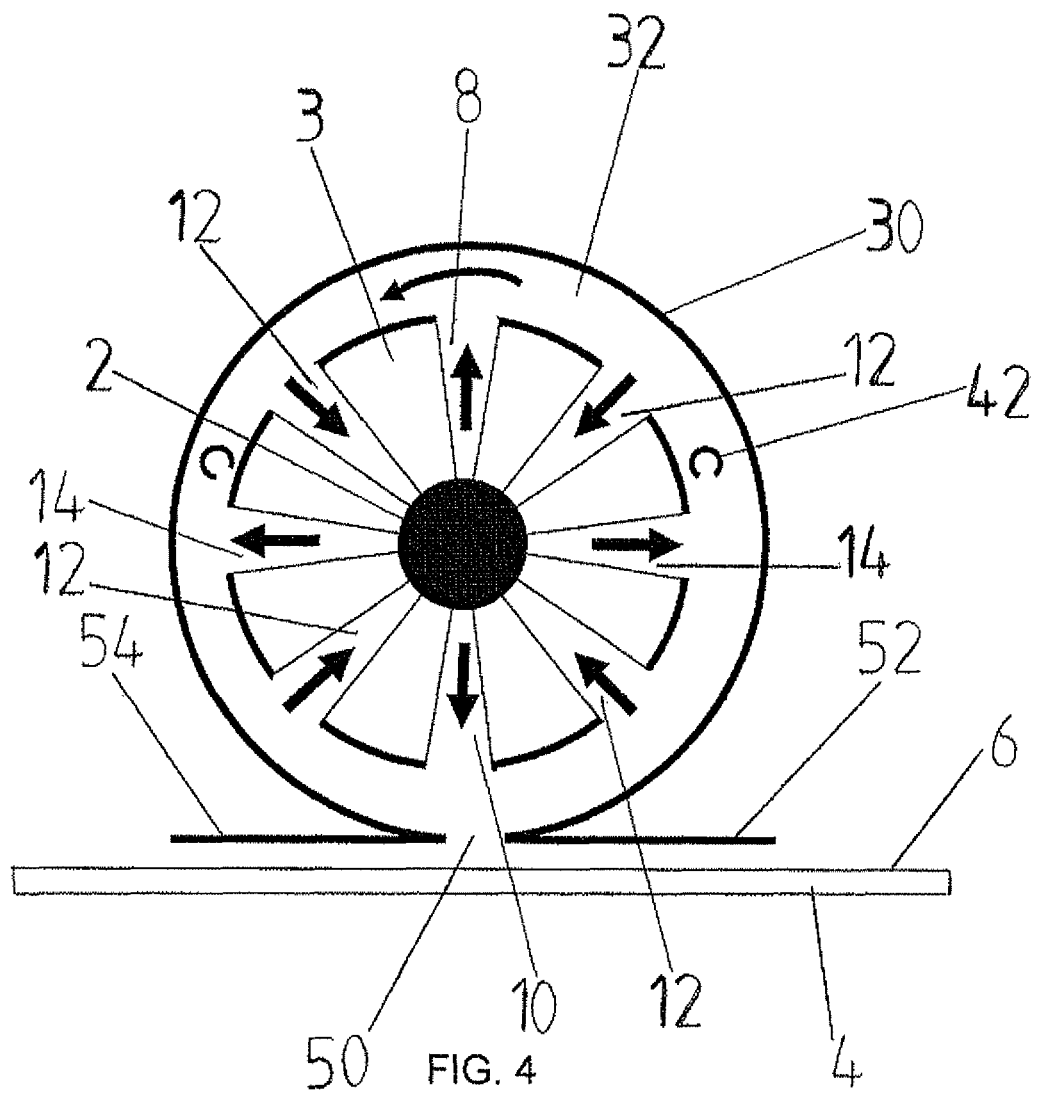
FIG. 4 shows yet another embodiment of the present invention in a schematic cross-sectional view.

In FIG. 4 is shown an alternative embodiment of a source comprising only one casing serving as a suction casing 30. The suction casing 30 forms a suction chamber 32 having suction openings 42 therein. The suction casing 30 further includes a flow opening 50 that extends substantially in the direction of the rotation axis 2 of the gas feed member 3 and allows precursors and possible flushing media C to be introduced therethrough to the surface 6 of the substrate 4 and, correspondingly, to be removed from the surface 6 of the substrate 4. As compared with the diameter of the gas feed member 3, the flow opening 50 is made narrow in a direction orthogonal with respect to the first rotation axis 2 in order to prevent the introduced gas A, B, C from spreading over a large area. Additionally the suction casing 30 is provided with a first and a second flange 52, 54 which, as shown in FIG. 4, extend from the edge of the flow opening 50 substantially parallel to the surface 6 of the substrate 4 and outwardly from the flow opening 50 and have a length corresponding to that of the first rotation axis 2 of the gas feed member 3. The flanges 52, 54 act as a diffusion barrier to prevent exhaust of gases from the flow opening 50 to the environment and, to conversely, from the environment to the flow opening thus facilitating effective coverage of the surface 6 of the substrate 4 by the precursors A, B under the flow opening 50. In certain embodiments the flanges 52 and 54 may also incorporate suction openings allowing removal of gases from the vicinity of the flow opening 50. The flanges 52, 54 shown in FIG. 4 can also be included in the source illustrated in FIG. 3, as well as in its casings or any other casing surrounding the gas feed member 3. It must further be noted that in certain embodiments the flange may have been placed only to one side of the flow opening 50. Also other types of diffusion barriers may be used to replace flanges 52, 54 or one of them.

Furthermore, the source 1 can be located in a separate deposition process chamber (not shown). The construction of the process chamber may be such that allows the substrate or substrates to be conveyed through the chamber. The process chamber can be operated at a vacuum or pressurized or at a normal atmospheric pressure (NTP; 1 bar, 0° C.). Alternatively the source 1 does not include a separate deposition process chamber but instead, the source 1 is operated directly in a room space, process space or in conjunction with some other equipment or chamber.

To a person skilled in the art it is obvious that the spirit of the invention may be implemented in a plurality of different ways along with the advancements of the art. Hence, the invention and its implementations are not limited by the above-described exemplary embodiments, but rather may be varied within the inventive spirit and scope of the appended claims.

The invention claimed is:

1. A source for feeding one or more gaseous precursors onto a surface of a substrate in order to process the substrate by way of subjecting the surface of the substrate being processed to alternately repetitive surface reactions of the precursors, said source comprising
a gas feed member for feeding at least one or more precursors onto the surface of the substrate, said gas feed member being adapted rotatable about a first rotation axis and said gas feed member being adapted to feed one or more precursors in a direction substantially transversal to said first rotation axis, wherein
in said gas feed member is a cylindrical part comprising one or more elongated gas feed channels extending in the direction of said first rotation axis for feeding one or more precursors in a direction substantially transversal to said first rotation axis, and
said source comprises one or more casings provided around the gas feed member for feeding or exhausting a gas, said one or more casing comprising a flow opening extending in the direction of the rotation axis for supplying gases to the surface of the substrate.

2. The source of claim 1, wherein said gas feed member is adapted to feed one or more precursors substantially radially or in a substantially perpendicular direction relative to the first rotation axis.

3. The source of claim 1, wherein said gas feed member comprises one or more elongated precursor feed channels for feeding one or more precursors, or that said gas feed member comprises one or more first elongated precursor feed channels for feeding a first precursor and one or more second elongated precursor feed channels for feeding a second precursor.

4. The source of claim 1, wherein said gas feed member comprises one or more flushing medium feed channels for feeding a flushing medium, or one or more suction channels for exhausting the precursors from the surface of the substrate, or one or more flushing medium feed channels for feeding a flushing medium and one or more suction channels for exhausting the precursors or flushing medium gases from the surface of the substrate.

5. The source of claim 4, wherein said flushing medium feed channels or said suction channels or said flushing medium feed channels and said suction channel are adapted for exhausting the precursors or flushing medium gases from the surface of the substrate substantially transversally, perpendicularly or radially relative to the first rotation axis of said gas feed member.

6. The source of claim 1, wherein one or more of the precursor feed channels, the flushing medium feed channels and the suction channels are provided in the gas feed member as recesses extending inward from its outer surface or as projections extending outward from its outer surface.

7. The source of claim 1, wherein said cylindrical gas feed member has a substantially circular cross section and a first end and a second end in the direction of the first rotation axis, or that the said cylindrical gas feed member has a substantially circular cross section and a first end and a second end in the direction of the first rotation axis and the precursor feed channels, the flushing medium feed channels or the suction channels extend between the first end and the second end of the gas feed member in a direction substantially parallel to the first rotation axis.

8. The source of claim 1, wherein the one or more of the precursor feed channels and of the flushing medium feed channels comprise one or more feed openings for feeding of a precursor or a flushing gas, or that the one or more of the precursor feed channels and of the flushing medium feed channels comprise one or more feed openings located in the direction of the first rotation axis along the length of the precursor feed channel or the flushing medium feed channel for permitting feeding of the precursor or the flushing medium substantially along the entire length of precursor feed channel or the flushing medium feed channel, or that the feed openings are located in the direction of the first rotation axis at the ends of the precursor feed channel or the flushing medium feed channel or in close vicinity thereof, or that the feed openings are located substantially in the direction of the first rotation axis at the middle of the length of the precursor feed channel or the flushing medium feed channel.

9. The source of claim 1, wherein the precursor feed channels or the flushing medium feed channels comprise one or more exhaust openings for removal of the precursor or the flushing gas, or that the precursor feed channels or the flushing medium feed channels comprise one or more exhaust openings located substantially in the direction of the first rotation axis at the middle of the length of the precursor feed channel or the flushing medium feed channel, while the feed openings are located at the ends of the precursor feed channel or the flushing medium feed channel or in close vicinity thereof, or that the exhaust openings in the direction of the first rotation axis are located at the ends of the precursor feed channel or the flushing medium feed channel or in close vicinity thereof, while the feed openings are located substantially at the middle of the length of the precursor feed channel or the flushing medium feed channel.

10. The source of claim 8, wherein the exhaust openings are located substantially in the direction of the first rotation axis at the first end of the precursor feed channel or the flushing medium feed channel or in close vicinity thereof and the feed openings are located at the other end of the precursor feed channel or the flushing medium feed channel or in close vicinity thereof.

11. The source of claim 1, wherein the gas feed member comprises one or more containers for the precursors or flushing media, or that the gas feed member comprises flow conduits for feeding the precursors or flushing media into the gas feed member from outside thereof.

12. A source for feeding one or more gaseous precursors onto a surface of a substrate in order to process the substrate by way of subjecting the surface of the substrate being processed to alternately repetitive surface reactions of the precursors, said source comprising
a gas feed member for feeding at least one or more precursors onto the surface of the substrate, the gas feed member being adapted rotatable about a first rotation axis and the gas feed member being adapted to feed one or more precursors in a direction substantially transversal to the first rotation axis, and one or more casings provided within each other around the gas feed member for feeding or removing a gas, wherein the gas feed member is a cylindrical part comprising one or more elongated gas feed channels extending in the direction of the first rotation axis for feeding one or more precursors in a direction substantially transversal to the first rotation axis.

13. The source of claim 12, wherein at least one of the casings is provided with one or more diffusion barriers for preventing gas flow between a surrounding environment and a flow opening.

14. The source of claim 1, wherein the source comprises a first casing provided to form a first suction chamber for exhausting gases, and/or a second casing provided to form a first feed chamber for feeding of a precursor or a flushing medium and/or a third casing provided to form a third chamber for exhausting gases.

15. An arrangement for processing a substrate by way of subjecting the surface of the substrate being processed to alternately repetitive surface reactions of precursors, the arrangement comprising one or more sources for feeding one or more gaseous precursors onto a surface of a substrate in order to process the substrate through subjecting the surface of the substrate to alternately repetitive surface reactions of precursors, the one or more sources comprising a gas feed member for feeding at least one or more precursors onto the surface of the substrate, the gas feed member being adapted rotatable about a first rotation axis and being adapted to feed one or more precursors in a direction substantially transversely to said first rotation axis, wherein said first rotation axis is adapted to extend substantially parallel to the surface of the substrate, and the one or more sources comprises one or more casings provided around the gas feed member for feeding or exhausting a gas, the one or more casings comprising a flow opening extending in the direction of the rotation axis for supplying gases to the surface of the substrate.

16. The arrangement of claim 15, wherein said one or more sources is a source for feeding one or more gaseous precursors onto the surface of the substrate in order to process the substrate by way of subjecting the surface of the substrate being processed to alternately repetitive surface reactions of the precursors, said source comprising the gas feed member for feeding at least one or more precursors onto the surface of the substrate, said gas feed member being adapted rotatable about a first rotation axis and said gas feed member being adapted to feed one or more precursors in a direction substantially transversal to said first rotation axis, wherein in said gas feed member is a cylindrical part comprising one or more elongated gas feed channels extending in the direction of said first rotation axis for feeding one or more precursors in a direction substantially transversal to said first rotation axis.

17. The arrangement of claim 15, wherein said source is provided movable relative to the substrate in a direction parallel to the surface of the substrate, or that said source is adapted rotatable about a second rotation axis aligned substantially perpendicularly relative to said first rotation axis and said surface of the substrate, or that source is provided movable relative to the substrate in a direction parallel to the surface of the substrate and rotatable about a second rotation axis aligned substantially perpendicularly relative to said first rotation axis and said surface of the substrate.

18. The arrangement of claim 15, wherein said source is disposed at a distance from the surface of the substrate, or that the said source is disposed at a distance of not greater than 1 cm from the surface of the substrate.

19. The arrangement of claim 16, wherein said source for feeding one or more gaseous precursors onto the surface of the substrate is aligned so that an open portion of a wall of the one or more casings is facing the surface of the substrate.

* * * * *